(12) United States Patent
Motika et al.

(10) Patent No.: US 6,961,886 B2
(45) Date of Patent: Nov. 1, 2005

(54) DIAGNOSTIC METHOD FOR STRUCTURAL SCAN CHAIN DESIGNS

(75) Inventors: Franco Motika, Hopewell Junction, NY (US); Phillip J. Nigh, Williston, VT (US); Phong T. Tran, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 10/249,513

(22) Filed: Apr. 16, 2003

(65) Prior Publication Data

US 2004/0210808 A1 Oct. 21, 2004

(51) Int. Cl.$^7$ ............................................... G01R 31/28
(52) U.S. Cl. ........................ 714/732; 714/729; 714/728
(58) Field of Search ................................. 714/732, 729, 714/728, 726, 724, 738, 739, 741, 30; 377/64, 27, 54

(56) References Cited

U.S. PATENT DOCUMENTS

| | | | |
|---|---|---|---|
| 3,961,251 A | 6/1976 | Hurley et al. ................. 324/73 |
| 4,481,627 A | 11/1984 | Beauchesne et al. .......... 371/21 |
| 4,503,537 A | 3/1985 | McAnney .................... 371/25 |
| 4,513,418 A | 4/1985 | Bardell, Jr. et al. ........... 371/25 |
| 5,612,963 A | * 3/1997 | Koenemann et al. ........ 714/739 |
| 5,831,992 A | * 11/1998 | Wu ............................ 714/732 |
| 5,954,830 A | 9/1999 | Ternullo, Jr. ................. 714/718 |
| 5,983,380 A | 11/1999 | Motika et al. ............... 714/733 |
| 5,987,635 A | 11/1999 | Kishi et al. .................. 714/724 |
| 5,996,097 A | 11/1999 | Evans et al. ................. 714/719 |
| 6,308,290 B1 | 10/2001 | Forlenza et al. ............. 714/724 |
| 6,442,723 B1 | 8/2002 | Koprowski et al. .......... 714/732 |
| 6,671,838 B1 | * 12/2003 | Koprowski et al. .......... 714/726 |
| 6,807,645 B2 | * 10/2004 | Angelotti et al. ............ 714/732 |

* cited by examiner

*Primary Examiner*—Christine T. Tu
(74) *Attorney, Agent, or Firm*—Schmeiser, Olsen & Watts; Robert A. Walsh

(57) ABSTRACT

A method for testing and diagnosing shift register latch chains coupled to logic circuits in an integrated circuit, the method including: (a) determining which of the shift register latch chains are failing by propagating a test pattern of zeros and ones through the shift register latch chains while gating which of the shift register latch chains contents are propagated into the means for generating a test signature; and (b) for each failing shift register latch chain: (b1) propagating a test pattern through the shift register latch chains while gating a selected sequential group of latches in a failing shift register latch to propagate into the means for generating a test signature; (b2) reducing the number of latches in the sequential group of latches; and (b3) repeating steps (b1) and (b2) until all failing latches of the failing shift register latch chain have been determined.

19 Claims, 6 Drawing Sheets

DIAGNOSTIC METHOD FOR STRUCTURAL SCAN CHAIN DESIGNS

BACKGROUND OF THE INVENTION

1. Field of the Invention

The present invention relates to the field of testing integrated circuits having logic circuits testable by on chip scan chains; more specifically, it relates to a method of diagnosing stuck-at fails of the scan chains.

2. Related Documents

This application is related to U.S. Pat. No. 6,442,723 to Koprowski et al., which is hereby incorporated by reference in its entirety.

3. Background of the Invention

Complex very large-scale integrated circuits contain very large numbers of logic circuits that require extensive testing. In order to mitigate the complexity of the testing required, scan based designs have been implemented. However, a problem with scan-based designs has been diagnosing fails, notably stuck-at one or stuck-at zero, of individual shift register latches (SRL) in the SRL chains. The difficulty of distinguishing with certainty fail signatures caused by failure of the logic circuits from fail signatures caused by stuck-at failure of individual SRLs in the SRL chains inhibits rapid determination of the root cause of the fail and can delay corrective action.

SUMMARY OF THE INVENTION

A first aspect of the present invention is an integrated circuit comprising: logic circuits connected to a shift register latch chain, the shift register latch chain comprising shift register latches; means for propagating a test pattern in the shift register latch chain through the logic circuits and into means for generating a test signature based on a response of the logic circuits to the test pattern, the test pattern supplied from a source external to the integrated circuit; means for selectively gating the contents of the shift registers into the means for generating the test signature based upon selected test patterns; and means for gating the contents of a sequential group of shift register latches into the means for generating the test signature based upon a specified range of SRL chain load/unload cycles, the range of SRL chain load/unload cycles determined by a selectable start and a selectable stop count.

A second aspect of the present invention is a method of testing and diagnosing an integrated circuit comprising: providing logic circuits connected to a shift register latch chain, the shift register latch chain comprised of shift register latches; providing means for propagating a test pattern in the shift register latch chain through the logic circuits and into means for generating a test signature based a response of the logic circuits to the test pattern, the test pattern supplied from a source external to the integrated circuit; and selectively gating the contents of the shift registers into the means for generating the test signature based upon selected test patterns.

A third aspect of the present invention is a method for testing and diagnosing broken or stuck-at shift register latch chains comprised of shift register latches, the shift register latch chains coupled to logic circuits in an integrated circuit, the method comprising in the order listed: (a) determining which of the shift register latch chains are failing by propagating a first test pattern of zeros and ones through the shift register latch chains while gating which of the shift register latch chains contents are propagated into the means for generating a test signature, the determination of failing shift register latch chains made on the basis of the test signature; and (b) for each failing shift register latch chain: (b1) propagating a second test pattern through the shift register latch chains while allowing only the contents of a selected sequential group of shift register latches in a failing shift register latch to propagate into the means for generating a test signature; (b2) reducing the number of shift register latches in the sequential group of shift register latches; and (c3) repeating steps (b1) and (b2) until all failing shift register latches of the failing shift register latch chain have been determined, the determination of failing shift register latches made on the basis of the test signature.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
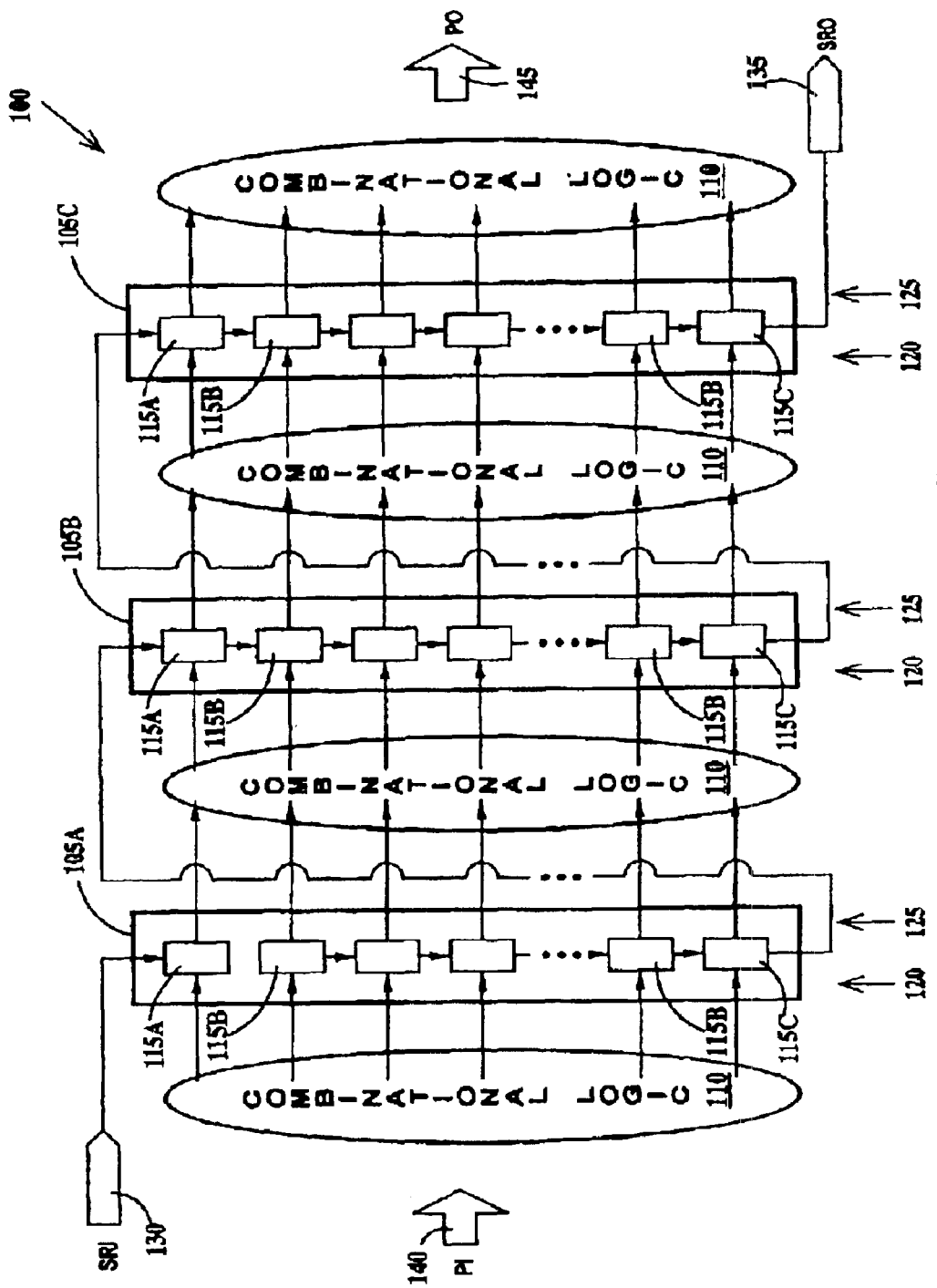
FIG. 1 is a block diagram illustrating the structural relationship between SRL chains and logic circuits according to the present invention.

FIG. 1 is a block diagram illustrating the structural relationship between scan chains and logic circuits according to the present invention. In FIG. 1, integrated circuit 100 includes SRL chains 105A, 105B and 105C interspersed between combinational logic 110. While three SRL chains 105A, 105B and 105C are illustrated in FIG. 1, any number of SRL chains may be utilized in a particular design. Combinational logic 10 comprises the logic circuits to be tested. SRL chains 105A, 105B and 105C comprise the means for stimulating and collecting test data relating to combinational logic 110.

Each SRL chain 105A, 105B and 105C comprises a first SRL 115A, intermediate SRLs 115B and a last SRL 115C all coupled in series. SRL chains 105A, 105B and 105C may contain the same number of SRLs or different numbers of SRLs. In practice, it is common for SRL chains to contain several thousand SRLs. SRL chains 105A, 115B and 105C are serial input/output shift registers. Each SRL 115A, 115B and 115C is selectively coupled to combinational logic circuits on an input side 120 and each SRL 115A, 115B and 115C is selectively coupled to different combinational logic circuits on an output side 125.

SRL chains 105A, 105B and 105C are themselves serially coupled. The first SRL 115A of SRL chain 105A is coupled to a shift register input (SRI) 130. The last SRL 115C of first SRL chain 105A is coupled to the first SRL 115A of second SRL chain 105B. The last SRL 115C of second SRL chain 105B is coupled to the first SRL 115A of SRL chain 105C. The last SRL 115C of SRL chain 105C is couple to a shift register output (SRO) 135. SRI 130 is used to serially input a test vector (a pattern of zeros and ones) into SRL chains 105A, 105B and 105C and SRO 135 is used to output a resultant vector from the SRL chains. SRL chain 105B is a receiving SRL chain for test data propagated from SRL chain 105A through combinational logic 110. SRL chain 105C is a receiving SRL chain for test data propagated from SRL chain 105B through combinational logic 110.

Combinational logic 110 includes a set of primary inputs (PI) 140 and a set of primary outputs (PO) 145. PI 140 and PO 145 are the normal input and outputs of combinational logic 110 during normal operation of integrated circuit 100.

Figure 2:
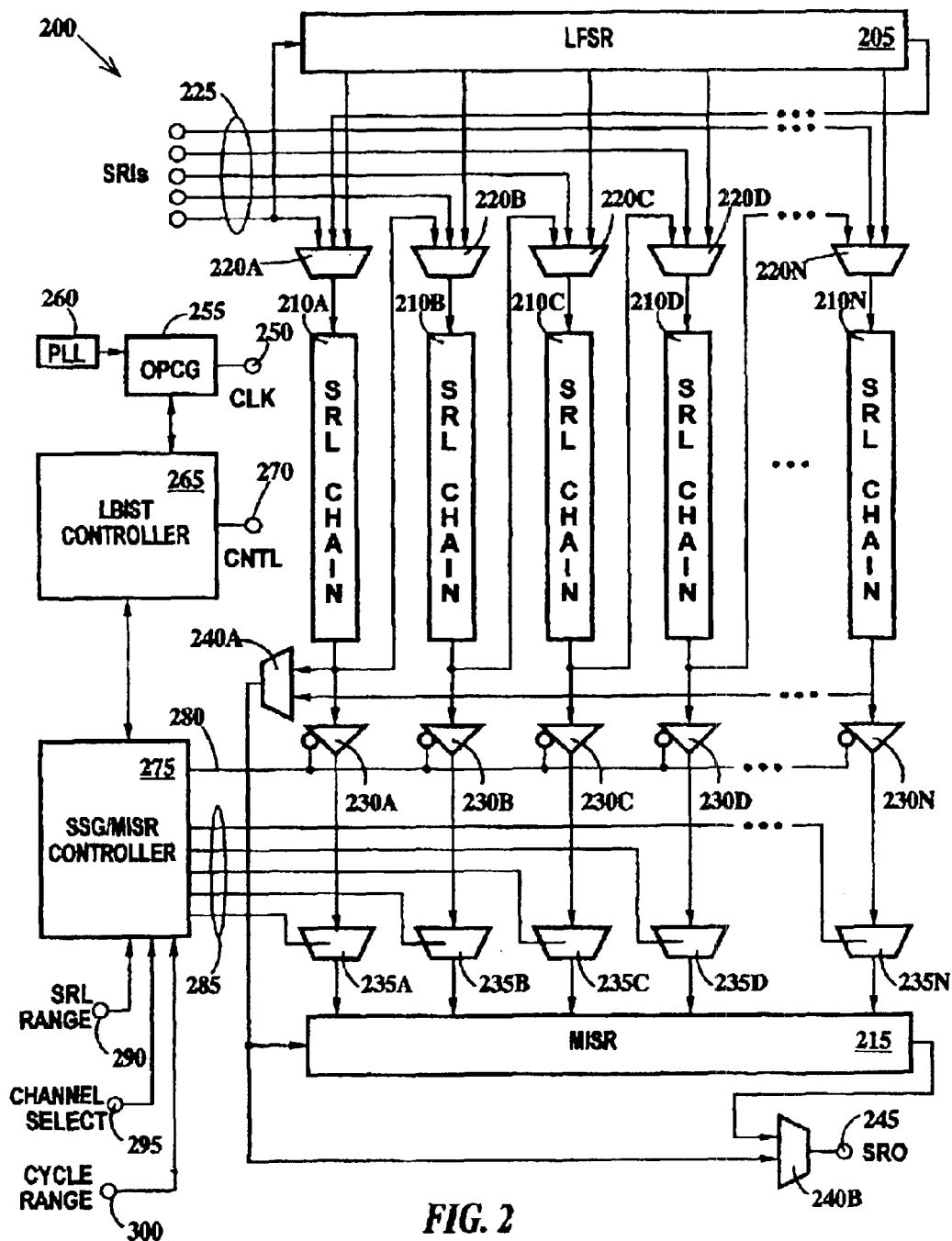
FIG. 2 is a block diagram illustrating an SRL chain based integrated circuit according to a first embodiment of the present invention.
Figure 3:
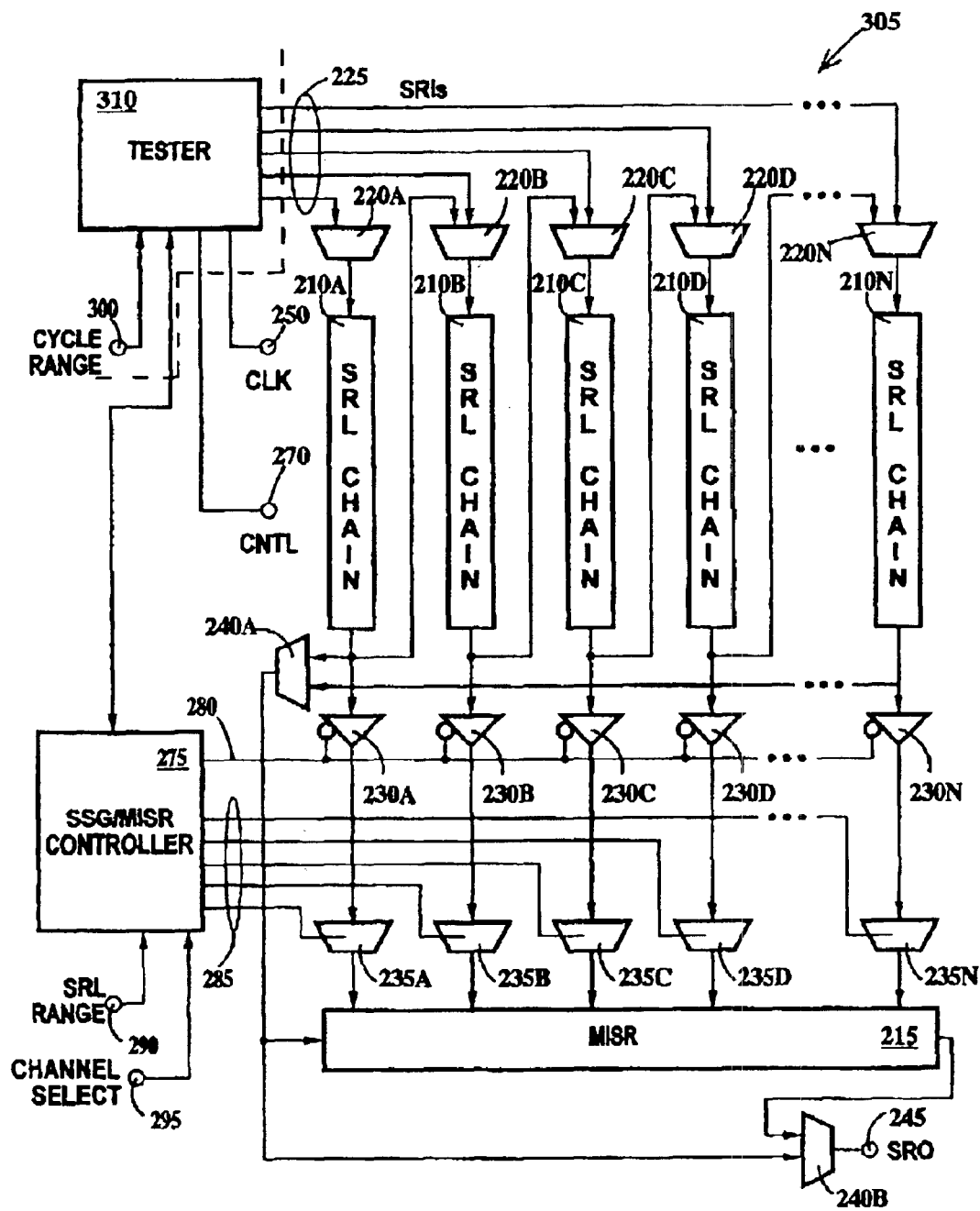
FIG. 3 is a block diagram illustrating an SRL chain based integrated circuit according to a second embodiment of the present invention.

In one implementation, level sensitive scan design (LSSD), each SRL 115A, 115B and 115C is implemented in an L1/L2 configuration where the output of the L1 or master SRL feeds n input of a corresponding slave L2 and the L1 has two data ports (one from combinational logic 110 and one from the previous SRL L2 output) and may be updated by either a first scan clock (A clock) or a functional clock Â© clock) while the L2 or slave SRL has an output to combinational logic 105 and is undatable by a second scan clock (B clock). The A and C clocks exclusive to each other are out of phase with the B clock. In FIGS. 2 and 3, the SRL chain structure is essentially the same as illustrated in FIG. 1 and described supra, however combinational logic 110, PI 140 and PO 145 are ,not illustrated but should be assumed. It should also be noted that an alternative name for an SRL chain in a set of serially coupled SRL chains is a STUMPS (Self-Test Using a MISR and a Parallel Shift-register) channel.

FIG. 2 is a block diagram illustrating an SRL chain based integrated circuit according to a first embodiment of the present invention. The first embodiment of the present invention describes a logic built-in self-test (LBIST) implementation. In FIG. 2, integrated circuit 200 includes a linear feedback shift register (LFSR) 205 which is one type of pseudo random pattern generator (PRPG), a set of serially coupled SRL chains 210A through 210N and a multiple input shift register (MISR) 215. SRL chain 210A is the first SRL chain and SRL chain 210N is the last SRL chain. Input to each SRL chain 210A through 210N is gated by a corresponding multiplexer 220A through 220N. A first input of each multiplexer 220A through 220N is coupled to a different SRI of a set of SRIs 225. SRIs 225 are supplied from an external device storing various test vectors. A second input of each multiplexer 220A through 220N is coupled to a different output of a set of outputs of LFSR 205. A third input of each multiplexer 220A through 220N is coupled to an output of the last SRL of the prior SRL chain, except the third input of multiplexer 220A is coupled to a still further output of LFSR 205. The input to LFSR 205 is coupled to the first input of multiplexer 220A.

The output of each SRL chain 210A through 210N is further coupled to an input of a corresponding controllable inverter 230A through 230N. Each controllable inverter 230A through 230N can be controlled to invert or not invert. The output of each controllable inverter 230A through 230N is coupled to an input of a corresponding multiplexer 235A through 235N. The output of each multiplexer 235A through 235N is coupled to a different input to MISR 215. The outputs of first SRL chain 210A and last SRL chain 210N are coupled to corresponding inputs of a multiplexer 240A. The output of multiplexer 240A is coupled to a serial input of MISR 215 as well as to a first input of multiplexer 240B. A serial input of MISR 215 is coupled to a second input of multiplexer 240B. The output of multiplexer 240B is coupled to a SRO 245.

LFSR 205 serves as a pseudo random pattern generator that loads the test vector to be applied to the combinational logic (see FIG. 1) through SRL chains 210A through 210N. MISR 215 generates a signature at SRO 245 representing the response of the combinational logic (see FIG. 1) to the test vector. MISR 215 effectively compresses the output of SRL chains 210A through 210N. Ideally, the signature for a specific failing gate in the combinational logic (see FIG. 1) is different from the signature of the same gate not failing, after a predetermined number of test cycles. A test cycle is defined as the serial replacement of data stored in every SRL of an SRL chain followed by a clocking sequence and requires as many SRL load/unload cycles as there are SRLs in the longest SRL chains. Each load/unload cycle shifts data from a preceding SRL in the SRL chain into an immediately following SRL in the SRL chain. A test pattern has as many data bits as there are SRLs in all SRL chains. The plurality of SRIs 225 and multiplexers 220A through 220N allow additional adjustment of the test vectors applied to SRL chains 210A through 210N.

Each test cycle, in addition to loading and unloading of SRL chains 210A through 210N, requires timed application of system clock signals 250 (i.e. clocks A, B and C described supra) to launch the test vector from the SRLs in sending SRL chains through the combinational logic and to capture the resulting response in corresponding SRLs in the receiving SRL chain. A phase lock loop (PLL) 260 generates a frequency signal used by an on product clock generator (OPCG) 255. to generate system clock signals 250.

Since combinational logic 110 (see FIG. 1) may require several different clocks and since thorough testing may require testing various path delays through the combinational logic, an LBIST controller 265 generates various control signals 270 that control, for example, multiplexers 220A through 220N, multiplexer 235 and multiplexer 240 as well as OPCG 255. A test interval may require relatively large numbers of test cycles after which the contents of MISR 215 (i.e. the MISR signature) is read through SRO 245 and compared to an expected signature. A test interval is defined as a number of test cycles followed by a signature unload sequence.

Integrated circuit 200 further includes a selective signature generator (SSG)/MISR controller 275. SSG/MISR controller 275 generates an inversion signal 280 coupled to controlled inverters 230A through 230N and a multiplicity of channel select signals 285, a different channel select signal is coupled to each multiplexer 235A through 235N. SSG/MISR controller 275 is also in two way communication with LBIST controller 265 in order to set three specific test resource parameters used to control the data input into MISR 215, namely: (1) test pattern cycle control, (2) SRL chain to MISR input selection and (3) SRL chain load/unload shift count range selection. To this end, SSG/MISR controller 275 has a SRL range input 290 for test pattern cycle control, a channel select input 295 for SRL chain to MISR input selection and a cycle range input 300 for SRL chain load/unload shift count control. SRL range input 290, channel select input 295 and cycle range input 300 are used to generate channel select signals 285.

By properly setting one or more of the aforementioned test resource parameters (via SRL range input 290, channel select input 295 and cycle range input 300) to conditionally control what test vector value is clocked from a particular SRL in a particular SRL chain 210A through 210N into MISR 215, a three-dimensional signature space can be generated. Note that the normal operation of integrated circuit 200 is not changed by the present invention. Integrated circuit 200 selectively and dynamically gates the movement of data (contents of individual SRLs) from SRL chains 210A through 210N into MISR 215.

The first signature dimension (test pattern cycle control) can be controlled by gating data input to MISR 215 active only for a specified group of test patterns. This may encompass all test patterns loaded and unloaded before or after a predefined a number of test cycles or within a range of test cycles. (See supra for the definition of a test cycle). The second signature dimension (SRL chain to MISR input selection) can be controlled by gating a specific SRL chain onto the corresponding MISR 215 input active. The complement of this condition is may be invoked, i.e. gating all but a specific SRL active. The third signature dimension (SRL chain load/unload shift count) can be controlled by gating MISR input active only for a specified range of SRL chain load/unload cycles that is determined by selectable and definable start and stop counts. The compliment of this condition may also be invoked, i e. gating MISR input active for all but a specified range of SRL chain load/unload cycles.

In addition to each single signature dimension, two or three-dimensional signatures can be generated by combining conditions on any two or all three signature dimensions simultaneously. Applying the methods illustrated in FIGS. 4, 5 and 6 and described infra to integrated circuit 200 allows quick and certain identification of the failing portion of the SRL chains 210A through 210N as well as the patterns causing the fails. Examples include: (1) identification of a sub-set of a test vector, (2) individual fail patterns (i.e. stuck-at), (3) failing SRL chains, (4) failing groups of SRLs in a particular SRL chain and (5) individual failing latch(es). Controllable inverters 230A through 230N are provided because the methods described infra require, in certain steps, inverting of the data bits unloaded from SRL chains 210A through 210N.

FIG. 3 is a block diagram illustrating an SRL chain based integrated circuit according to a second embodiment of the present invention. The second embodiment of the present invention describes a general scan design implementation. In FIG. 3, integrated circuit 305 includes all the structure and interconnections of the first embodiment of the present invention illustrated in FIG. 2 and described supra with the following exceptions. LFSR 205 and its connections to multiplexers 220A through 220N are not present and LBIST controller 265, OPCG 255 and PLL 260 (see FIG. 2) are replaced with an external tester 310. Further differences are cycle range input 300 is coupled to tester 310 and system clock signals 250 and control signals 270 are generated by tester 310. Another difference is SSG/MISR controller 275 is in two-way communication with tester 310. The operation of integrated circuit 305 is similar to that of integrated circuit 200 described supra. (See FIG. 2 and corresponding description).

Figure 4:
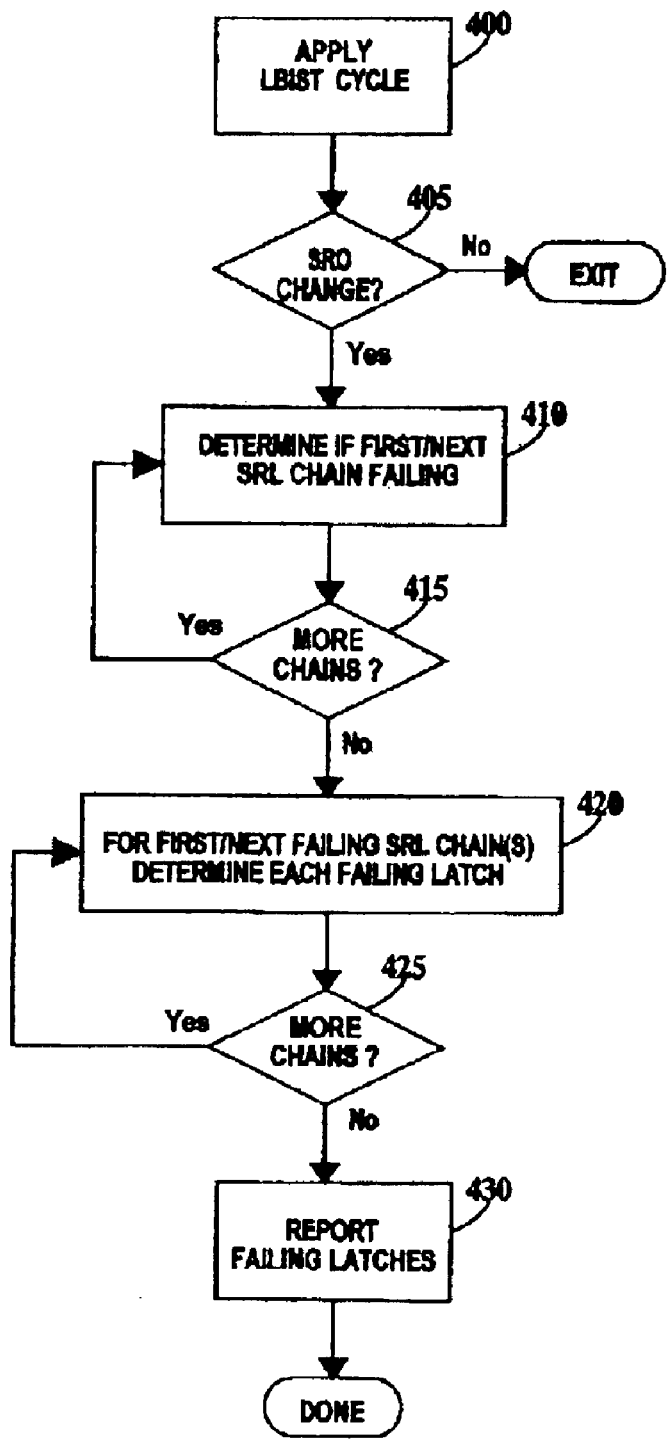
FIGS. 4, 5 and 6 are flowcharts illustrating a method of the present invention.
Figure 5:
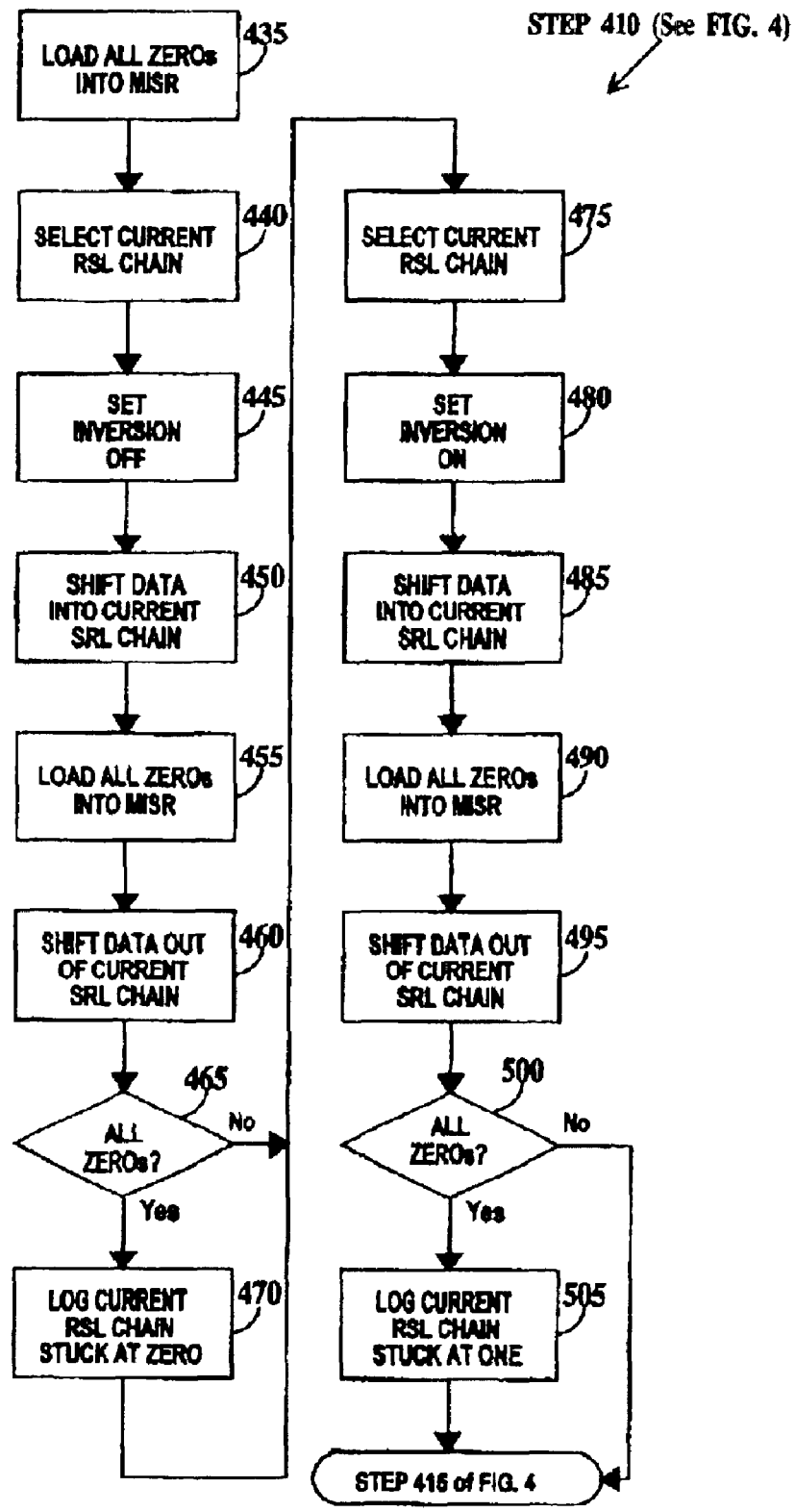
Figure 6:
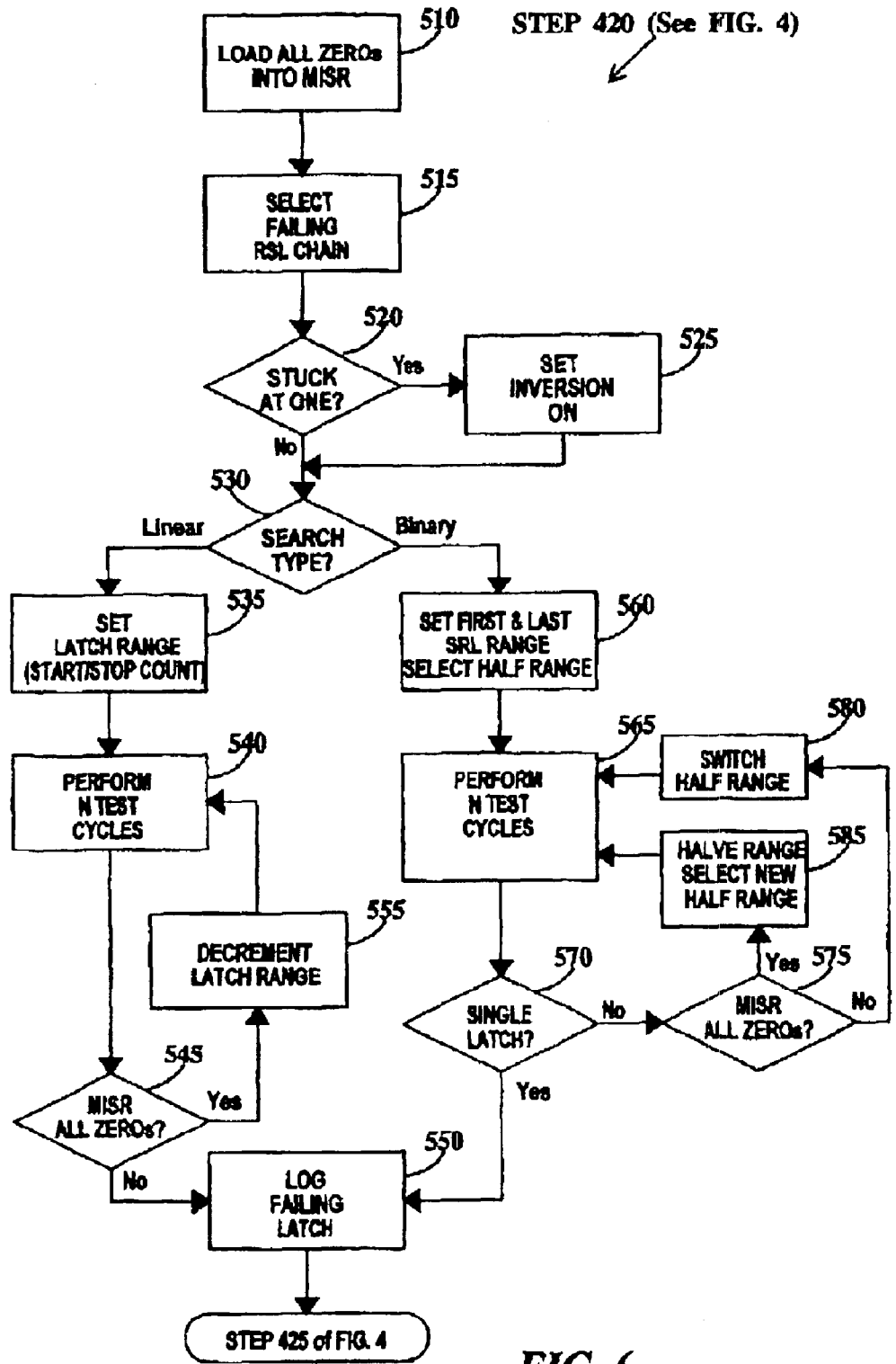

FIGS. 4, 5 and 6 are flowcharts illustrating the method of the present invention. Unless otherwise noted, the method described infra is applicable to both the first and second embodiment of the present invention. Turning to FIG. 4, in step 400, a limited number of LBIST cycles are performed and in step 405, it is determined if the MISR signature changes. If in step 405, it is determined that the MISR signature does not change, a problem with the LBIST controller is probable and the method terminates as a functioning LBIST controller is required. If however, the MISR signature does change, then the method proceeds to step 410. In the second embodiment of the present invention, steps 400 and 405 may be eliminated since there is no LBIST controller.

In step 410, it is determined if the first/next SRL chain is failing. This may be accomplished by selecting performing a load/unload cycle to the current SRL chain without any system clocks for both inverted and non-inverted data shifted from the current SRL chain into the MISR. Step 410 is expanded in FIG. 5 and described more fully infra. In step 415, it is determined if there are additional SRL chains to check. If in step 415, it is determined that there are additional SRL chains to check then the method loops to step 410; otherwise the method proceeds to step 420.

In step 420, for each SRL chain identified as failing in step 410, each SRL in the failing SRL is determined. Identification of failing SRLs is accomplished by application of three signature dimensions as described supra. Step 420 is expanded in FIG. 6 and described more fully infra. In step 425, it is determined if there are additional SRLs to check. If in step 425, it is determined that there are additional SRLs to check then the method loops to step 420; otherwise the method proceeds to step 430. In step 430, a report of failing SRLs is generated, including if the fail is a stuck-at one or a stuck-at zero.

Turning to FIG. 5 which represents an expansion of step 410 of FIG. 4. in step 435, the MISR is initialized by serially shifting a pattern of all 0-bits into the latches of the MISR. In step 440, the current SRL chain is selected by use of the multiplexer between the output of the current SRL chain and the corresponding input of the MISR (see FIGS. 2 and 3). In step 445, the corresponding controllable inverter between the output of the current SRL chain and the corresponding multiplexer is set to not invert; i.e. 0-bits remain 0-bits and 1-bits remain 1-bits. In step 450, a random pattern of zeros and ones is shifted into the current SRL chain from either the LFSR in the case of the first embodiment (see FIG. 2) or from the tester in the case of the second embodiment (see FIG. 3). The random pattern of zeros and ones is approximately half zeros and half ones. In step 455, the MISR is cleared by shifting a pattern of all 0-bits into the MISR. In step 460, data in the current SRL chain is shifted into the MISR. In step 465, it is determined if the MISR signature at the SRO is all 0-bits. If in step 465, it is determined that the MISR signature is all 0-bits then in step 470, a stuck-at zero fail is logged for the current RSL chain and the method proceeds to step 475; otherwise the method proceeds directly to step 475.

In step 475, the current SRL chain is selected by use of the multiplexer between the output of the selected SRL chain and the corresponding input of the MISR (see FIGS. 2 and 3). In step 480, the corresponding controllable inverter between the output of the current SRL chain and the corresponding multiplexer is set to invert; i.e. 0-bits become 1-bits and 1-bits become 0-bits. In step 485, a random pattern of zeros and ones is shifted into the current SRL chain from either the LFSR in the case of the first embodiment (see FIG. 2) or from the tester in the case of the second embodiment (see FIG. 3). The random pattern of zeros and ones is approximately half zeros and half ones. In step 490, the MISR is cleared by shifting a pattern of all 0-bits into the MISR. In step 495, data in the current SRL chain is shifted into the MISR. In step 500, it is determined if the MISR signature at the SRO is all 0-bits. If in step 500 it is determined that the MISR signature is all 0-bits then in step 505, a stuck-at one fail the method proceeds to step 415 of FIG. 4, otherwise the method proceeds directly to step 415 of FIG. 4.

Turning to FIG. 6 which represents an expansion of step 420 of FIG. 4, in step 510, the MISR is initialized by serially shifting a pattern of all 0-bits into the latches of the MISR. In step 515, the current failing SRL chain is selected by use of the multiplexer between the output of the current SRL chain and the corresponding input of the MISR (see FIGS.

2 and 3). In step 520, it is determined if the fail mode of the current SRL is a stuck-at one (the type of fail was determined in step 410 of FIG. 4). If in step 520, the type of fail was a stuck at one, then in step 525 the corresponding controllable inverter between the output of the current SRL chain and the corresponding multiplexer is set to invert; i.e. 0-bits become 1-bits and 1-bits become 0-bits and the method proceeds to step 530; otherwise the method proceeds directly to step 530. In step 530, a determination as to the type of search algorithm to use in searching for failing SRLs is made. If a linear search algorithm is selected, the method proceeds to step 535. If a binary search algorithm is selected, the method proceeds to step 560.

Assuming a linear search is selected in step 530 then in step 535, the SRL range (start and stop count) is set. The SRL range is set via the SRL chain load/unload shift count parameter described supra, which gates MISR input to a specified range of SRL chain unload cycles defined by a start and stop count. Next in step 540, a number (N) of test cycles are performed. Only data from latches in the latch range are loaded into the MISR. In step 545, it is determined if the MISR signature at the SRO is all 0-bits. If in step 545, it is determined that the MISR signature not all 0-bits then in step 550, failing SRL of the current SRL chain has been identified and is logged and the method proceeds to step 425 of FIG. 4; otherwise the method proceeds to step 555. In step 555, the SRL range is decremented by one and the method loops to step 540.

Assuming a binary search is selected in step 530 then in step 560, the SRL range (start and stop count) is set and half the range is selected. The SRL range is set via the SRL chain load/unload shift count parameter described supra, which gates MISR input to a specified range of SRL chain unload cycles defined by a start and stop count. Next in step 565, a number (N) of test cycles are performed. Only data from latches in the latch range are loaded into the MISR. In step 570, it is determined if the current half range encompasses only a single SRL. If in step 570, it is determined that the current half range encompasses only a single SRL then in step 550, the failing SRL of the current SRL chain has been identified and is logged and the method proceeds to step 425 of FIG. 4, otherwise the method proceeds to step 575. In step 575, it is determined if the MISR signature at the SRO is all 0-bits.

If in step 575, it is determined that the MISR signature all 0-bits then in step 580, the remaining half range is selected and the method loops to step 565; otherwise in step 585, the SRL current half range halved, one half selected and the method loops to step 565.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An integrated circuit comprising:
  logic circuits connected to a shift register latch chain, said shift register latch chain comprising shift register latches;
  means for propagating a test pattern in said shift register latch chain through said logic circuits and into means for generating a test signature based on a response of said logic circuits to said test pattern, said test pattern supplied from a source external to said intergrated circuit;
  means for selectively gating the contents of said shift registers into said means for generating said test signature based upon selected test patterns; and
  means for gating the contents of a sequential group of shift register latches into said means for generating said test signature based upon a specified range of SRL chain load/unload cycles, said range of SRL chain load/unload cycles determined by a selectable start and a selectable stop count.

2. The intergrated circuit of claim 1:
  wherein said shift register latch chain is divided into sub-shift register latch chains; and
  said integrated circuit further including means for gating the contents of shift register latches in one or more sub-shift register chains into said means for generating said test signature.

3. The intergrated circuit of claim 2, further including means for inverting or not inverting the contents of each shift register latch in said sub-shift register latch chains before propagating the contents of each shift register latch into said means for generating said test signature.

4. The integrated circuit of claim 2, wherein said means for gating the contents of shift register latches in a range of shift register latches is responsive to a sub-shift register latch chain load/unload shift count parameter, said means for gating the contents of shift register latches based upon a range of load/unload cycles is responsive to a pattern cycle control parameter and said means for gating the contents of shift register latches in one or more sub-shift register chains is responsive to a sub-shift register latch chain to means for generating a test signature selection parameter.

5. The integrated circuit of claim 1, further including means for inverting or not inverting the contents of each shift register latch in said shift register latch chain before propagating the contents of each shift register latch into said means for generating said test signature.

6. The integrated circuit of claim 1, wherein said source supplying said test pattern is a external tester or an external pseudo random pattern generator.

7. A method of testing and diagnosing an integrated circuit comprising:
  providing logic circuits connected to a shift register latch chain, said shift register latch chain comprised of shift register latches;
  providing means for propagating a test pattern in said shift register latch chain through said logic circuits and into means for generating a test signature based a response of said logic circuits to said test pattern, said test pattern supplied from a source external to said integrated circuit;
  selectively gating the contents of said shift registers into said means for generation said test signature based upon selected test patterns; and
  gating the contents of a sequential group of shift register latches into said means for generating said test signature based upon a specified range of SRL chain load/unload cycles, said range of SRL chain load/unload cycles determined by a selectable start and a selectable stop count.

8. The method of claim 7:
wherein said shift register latch chain is divided into sub-shift register or latch chains; and
said method further including gating the contents of shift register latches in one or more sub-shift register chains into said means for generating said test signature.

9. The method of claim 8, further including inverting or not inverting the contents of each shift register latch in said sub-shift register latch chains before propagating the contents of each shift register latch into said means for generating said test signature.

10. The method of claim 7, further including inverting or not inverting the contents of each shift register latch in said shift register latch chain before propagating the contents of each shift register latch into said means for generating said test signature.

11. The method of claim 7, said source supplying said test pattern is a external tester or an external pseudo random pattern generator.

12. A method for testing and diagnosing broken or stuck-at shift register latch chains comprised of shift register latches, said shift register latch chains coupled to logic circuits in an integrated circuit, the method comprising in the order listed:
(a) determining which of said shift register latch chains are failing propagating a first test pattern of zeros and ones through said shift register latch chains while gating which of said shift register latch chains contents are propagated into said means for generating a test signature, said determination of failing shift register latch chains made on the basis of said test signature; and
(b) for each failing shift register latch chain;
(b1) propagating a second test pattern through said shift register latch chains while allowing only the contents of a selected sequential group of shift register latches in a failing shift register latch to propagate into said means for generating a test signature;
(b2) reducing the number of shift register latches in said sequential group of shift register latches; and
(c3) repeating steps (b1) and (b2) until all failing shift register latches of the failing shift register latch chain have been determined, said determination of failing shift register latches made on the basis of said test signature.

13. The method of claim 12, further including before step (a) propagating a test pattern of zeros and ones through said shift register latch chains without propagating said test pattern through said logic circuits in order to test logic built-in self-test circuits coupled to said logic circuits and to said shift-register latch chains.

14. The method of claim 12, wherein step (a) is performed twice in immediate succession, the second performance of step (a) further including inverting the contents of said shift register latch chains before propagation of the contents of said shift register latch chains into said means for generating a test signature.

15. The method of claim 12, wherein step (b1) further includes inverting the contents of said selected sequential group of shift register latches in a failing shift register latch chain before propagating said contents of said range of shift register latches into said means for generating a test signature.

16. The method of claim 12, wherein step (b2) includes performing a linear reduction algorithm or performing a binary reduction algorithm.

17. The method of claim 12, wherein said first and second test patterns are generated from a tester external to said integrated circuit, a pseudo random pattern generator external to said integrated circuit or a logic built-in self-test circuit internal to said integrated circuit.

18. The method of claim 14, wherein step (b1) includes loading a predetermined pattern into said means for generating a test signature prior to said propagating said second test pattern through said shift register latch chains in order to determine if said integrated circuit is failing.

19. The method of claim 12, wherein said second test pattern is all zeros or all ones.

* * * * *

UNITED STATES PATENT AND TRADEMARK OFFICE
CERTIFICATE OF CORRECTION

PATENT NO. : 6,961,886 B2
DATED : November 1, 2005
INVENTOR(S) : Motika et al.

It is certified that error appears in the above-identified patent and that said Letters Patent is hereby corrected as shown below:

<u>Column 8,</u>
Line 60, delete "generation" and insert -- generating --.

<u>Column 9,</u>
Line 3, delete "register or latch" and insert -- register latch --.
Line 26, delete "failing proprogating" and insert -- failing by propagating --.
Line 38, delete "latch to" and insert -- latch chain to --.

Signed and Sealed this

Third Day of January, 2006

JON W. DUDAS
*Director of the United States Patent and Trademark Office*